United States Patent
Tanaka

(10) Patent No.: US 11,355,344 B2
(45) Date of Patent: Jun. 7, 2022

(54) CHUCK PLATE, ANNEALING DEVICE, AND ANNEALING METHOD

(71) Applicant: SUMITOMO HEAVY INDUSTRIES, LTD., Tokyo (JP)

(72) Inventor: Teppei Tanaka, Kanagawa (JP)

(73) Assignee: SUMITOMO HEAVY INDUSTRIES, LTD., Tokyo (JP)

(*) Notice: Subject to any disclaimer, the term of this patent is extended or adjusted under 35 U.S.C. 154(b) by 56 days.

(21) Appl. No.: 16/899,801

(22) Filed: Jun. 12, 2020

(65) Prior Publication Data

US 2020/0312664 A1    Oct. 1, 2020

Related U.S. Application Data

(63) Continuation of application No. PCT/JP2018/042511, filed on Nov. 16, 2018.

(30) Foreign Application Priority Data

Dec. 15, 2017 (JP) .............................. JP2017-240419
Dec. 15, 2017 (JP) .............................. JP2017-240420

(51) Int. Cl.
  *H01L 21/268* (2006.01)
  *H01L 21/67* (2006.01)
  *H01L 21/66* (2006.01)

(52) U.S. Cl.
  CPC ...... *H01L 21/268* (2013.01); *H01L 21/67115* (2013.01); *H01L 22/12* (2013.01)

(58) Field of Classification Search
  CPC . H01L 21/268; H01L 21/67115; H01L 22/12; H01L 21/683; H01L 21/68757; H01L 21/67248
  USPC .......................................................... 438/14
  See application file for complete search history.

(56) References Cited

U.S. PATENT DOCUMENTS

| 7,247,813 | B2 | 7/2007 | Jyumonji et al. |
| 7,405,141 | B2 | 7/2008 | Jyumonji et al. |
| 7,731,798 | B2 | 6/2010 | Shareef et al. |
| 9,302,348 | B2 | 4/2016 | Wang et al. |
| 9,475,150 | B2* | 10/2016 | McWhirter .......... B23K 26/352 |
| 2006/0113290 | A1* | 6/2006 | Shareef ................ B23K 26/703 |
| | | | 219/121.82 |
| 2008/0226272 | A1 | 9/2008 | Kasai et al. |

(Continued)

FOREIGN PATENT DOCUMENTS

| JP | 2006-110583 A | 4/2006 |
| JP | 2006-140230 A | 6/2006 |

(Continued)

OTHER PUBLICATIONS

Search Report issued in European Patent Application No. 18887501.7, dated Jan. 28, 2021.

(Continued)

*Primary Examiner* — Vu A Vu
(74) *Attorney, Agent, or Firm* — Michael Best & Friedrich LLP

(57) ABSTRACT

A chuck plate is disposed between an annealing object and a holding table. The chuck plate has a function of attenuating thermal radiation light radiated from the annealing object and directed toward the holding table. The use of the chuck plate makes it possible to increase the accuracy of temperature measured by detection of thermal radiation light.

16 Claims, 14 Drawing Sheets

(56) References Cited

U.S. PATENT DOCUMENTS

| | | | | |
|---|---|---|---|---|
| 2013/0005066 | A1* | 1/2013 | Sun | B41M 5/42 |
| | | | | 438/46 |
| 2016/0086832 | A1 | 3/2016 | Hawryluk et al. | |
| 2017/0263466 | A1* | 9/2017 | Ranish | H01L 21/67115 |

FOREIGN PATENT DOCUMENTS

| | | | |
|---|---|---|---|
| JP | 2006-156915 | A | 6/2006 |
| JP | 2006-298607 | A | 11/2006 |
| JP | 2008-235858 | A | 10/2008 |
| JP | 2008-251839 | A | 10/2008 |
| JP | 2011-187760 | A | 9/2011 |
| JP | 2012-134228 | A | 7/2012 |
| JP | 2014-192277 | A | 10/2014 |
| JP | 2016-127157 | A | 7/2016 |

OTHER PUBLICATIONS

International Search Report issued in Application No. PCT/JP2018/042511, dated Feb. 19, 2019.

* cited by examiner $$OVRx = \frac{Wov}{Wx}$$

$$OVRy = \frac{Lov}{Ly}$$

CHUCK PLATE, ANNEALING DEVICE, AND ANNEALING METHOD

RELATED APPLICATIONS

The contents of Japanese Patent Application Nos. 2017-240419 and 2017-240420, and of International Patent Application No. PCT/JP2018/042511, on the basis of each of which priority benefits are claimed in an accompanying application data sheet, are in their entirety incorporated herein by reference.

BACKGROUND

Technical Field

Certain embodiments of the present invention relate to a chuck plate, an annealing device, and an annealing method.

Description of Related Art

The related art discloses a technique for measuring a temperature of a surface of a semiconductor in rapidly heating a semiconductor wafer using a flash lamp annealing method. For example, the temperature of the semiconductor surface can be measured by detecting thermal radiation light from a semiconductor wafer surface.

In measuring a surface temperature of the semiconductor wafer by detecting thermal radiation light from the semiconductor wafer, a situation in which an accurate temperature is hardly measured due to various factors may occur. For example, in a case where the semiconductor wafer is held and heated through a chuck plate on a holding table, it has become clear that a phenomenon of degradation of measurement accuracy occurs due to the shape or the like of the chuck plate or the holding table below the semiconductor wafer.

SUMMARY

According to an embodiment of the present invention, there is provided a chuck plate that is disposed between an annealing object and a holding table for use, and has a function of attenuating thermal radiation light radiated from the annealing object and directed toward the holding table.

According to another embodiment of the present invention, there is provided an annealing device including: a holding table that holds an annealing object; a chuck plate that is disposed between the holding table and the annealing object; a heating mechanism that heats the annealing object held on the holding table; and a thermal radiation light detector that is held on the holding table and detects thermal radiation light from the annealing object heated by the heating mechanism, in which the chuck plate has a function of attenuating thermal radiation light radiated from the annealing object and directed toward the holding table.

According to still another embodiment of the present invention, there is provided an annealing method including: holding an annealing object on a holding table; heating the annealing object held on the holding table; measuring intensity of thermal radiation light directed upward from the heated annealing object; and absorbing or attenuating thermal radiation light directed toward the holding table from the heated annealing object, reflected by the holding table, transmitted through the annealing object, and directed toward above the annealing object.

DETAILED DESCRIPTION

It is desirable to provide a chuck plate, an annealing device, and an annealing method capable of increasing accuracy of temperature measurement with detection of thermal radiation light.

It is possible to attenuate thermal radiation light directed downward from the annealing object, reflected by the holding table, transmitted through the chuck plate and the annealing object, and directed upward. As a result, the measurement of the intensity of thermal radiation light is hardly affected by the chuck plate or the holding table.

A laser annealing device according to an embodiment will be described referring to FIGS. 1, 2A, and 2B.

Figure 1:
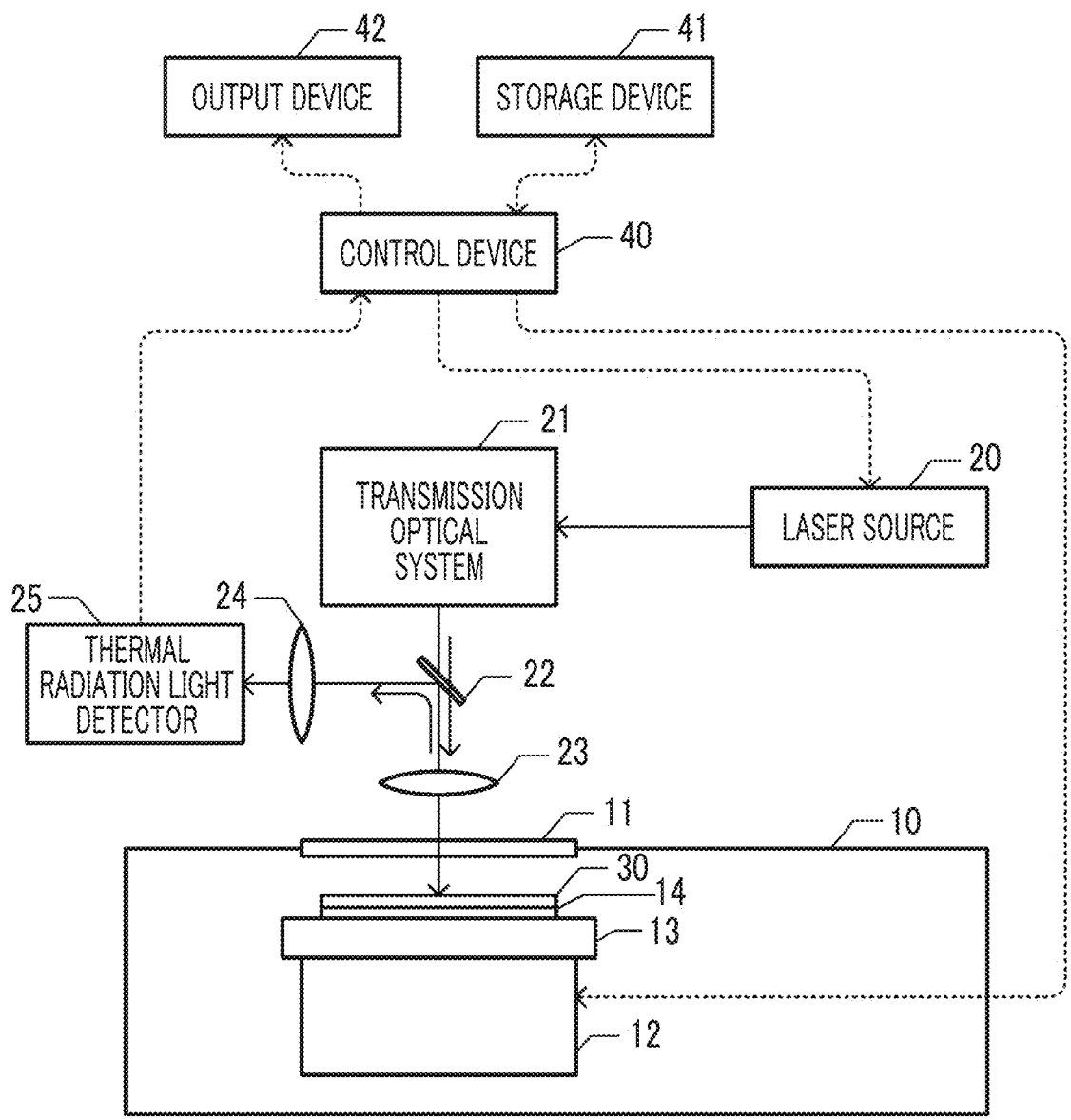
FIG. 1 is a schematic view of a laser annealing device according to an embodiment.

FIG. 1 is a schematic view of the laser annealing device according to the embodiment. A holding table 13 is supported in a chamber 10 by a scanning mechanism 12. The scanning mechanism 12 can move the holding table 13 within a horizontal plane with reception of a command from a control device 40. The scanning mechanism 12 includes an encoder, and positional information representing a current position of the holding table 13 is read from the encoder into the control device 40. An annealing object 30 is held on the holding table 13 through a chuck plate 14. The holding table 13 includes a vacuum chuck mechanism, and the chuck plate 14 has a plurality of through-holes through which the vacuum chuck mechanism of the holding table 13 acts on the annealing object 30. The annealing object 30 is, for example, a semiconductor wafer, such as a silicon wafer, implanted with a dopant. The laser annealing device according to the embodiment performs, for example, activation annealing of the dopant.

The holding table 13 is formed of, for example, a metal, such as aluminum. For the chuck plate 14, a material harder than the material of the holding table 13, for example, ceramic or the like is used. The chuck plate 14 is used while being disposed between the holding table 13 and the annealing object 30, and used, for example, for the purpose of obtaining high surface accuracy.

A laser source 20 outputs a pulsed laser beam for annealing with reception of a command from the control device 40. As the laser source 20, for example, a laser diode having an oscillation wavelength of about 800 nm is used. The laser beam output from the laser source 20 passes through a transmission optical system 21, a dichroic mirror 22, and a lens 23, is transmitted through a laser transmission window 11 provided in a top plate of the chamber 10, and is incident on the annealing object 30. The dichroic mirror 22 transmits the pulsed laser beam for annealing. The transmission optical system 21 includes, for example, a beam homogenizer, a lens, a mirror, and the like. With the beam homogenizer and the lens 23, a beam spot on the surface of the annealing object 30 is shaped, and a beam profile is homogenized.

Thermal radiation light radiated from the annealing object 30 is transmitted through the laser transmission window 11, passes through the lens 23, is reflected by the dichroic mirror 22, and is incident on a thermal radiation light detector 25 by way of a lens 24. The dichroic mirror 22 reflects thermal radiation light in a wavelength range having a wavelength equal to or greater than 1 µm. The thermal radiation light detector 25 measures intensity of thermal radiation light in a specific wavelength range. The intensity of thermal radiation light depends on a temperature of the annealing object 30. A measurement result of thermal radiation light of the thermal radiation light detector 25 is input to the control device 40 as a voltage value.

The lens 23 and the lens 24 image the surface of the annealing object 30 on a light receiving surface of the thermal radiation light detector 25. With this, the intensity of thermal radiation light radiated from a region of the surface of the annealing object 30 having a relationship conjugate with the light receiving surface of the thermal radiation light detector 25 is measured. A surface region to be measured is set, for example, to be included inside the beam spot of the laser beam.

The control device 40 performs control such that the scanning mechanism 12 moves the annealing object 30 held on the holding table 13 in a two-dimensional direction within the horizontal plane. The control device 40 performs control such that the laser source 20 outputs the pulsed laser beam based on current position information of the holding table 13. The control device 40 acquires a detection result of the thermal radiation light detector 25 in synchronization with each shot of the pulsed laser beam output from the laser source 20. The acquired detection result is stored in a storage device 41 in association with an in-plane position of the annealing object 30.

As an example, a temporal change in intensity of thermal radiation light is obtained for each shot of the pulsed laser beam. The detection result stored in the storage device 41 is, for example, a peak value or an integrated value of the intensity of thermal radiation light for each shot of the pulsed laser beam. The control device 40 outputs information regarding an intensity distribution of thermal radiation light within the surface of the annealing object 30 to an output device 42 as an image, a graph, or a numerical value.

Figure 2A:
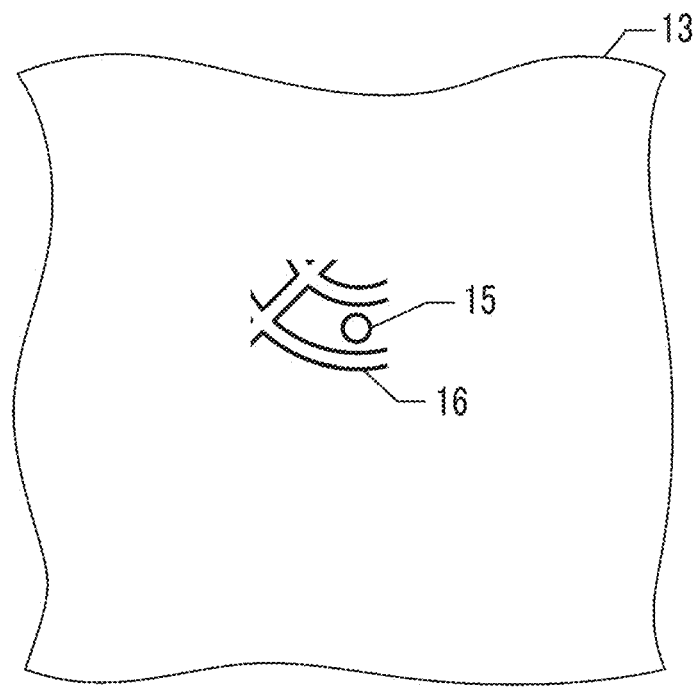
FIG. 2A is a plan view of a portion of a holding table.

FIG. 2A is a plan view of a portion of the holding table 13. Holes 15 and grooves 16 are provided in an upper surface of the holding table 13. The holes 15 and the grooves 16 constitute, for example, a part of a holding mechanism that holds the annealing object 30.

Figure 2B:
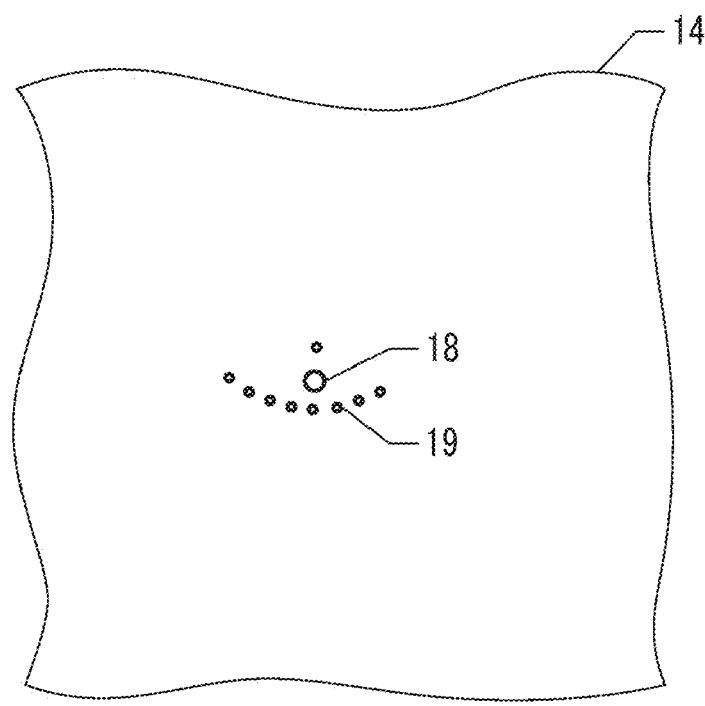
FIG. 2B is a plan view of a portion of a chuck plate.

FIG. 2B is a plan view of a portion of the chuck plate 14. In a case where the chuck plate 14 is placed while being aligned with the holding table 13, through-holes 18 are provided at positions corresponding to the holes 15 of the holding table 13. A plurality of through-holes 19 are distributed along the grooves 16 of the holding table 13. A region where the through-holes 18 and 19 are not disposed is a uniform flat surface. In a case where the annealing object 30 is held on an upper surface of the chuck plate 14, the annealing object 30 comes into contact with the uniform flat surface, and in the region where the through-holes 18 and 19 are disposed, the annealing object 30 does not come into contact with the chuck plate 14. In this way, the upper surface of the chuck plate 14 includes a uniform region where the chuck plate 14 comes into contact with the annealing object 30 in a state in which the annealing object 30 is held and a noncontact region where the chuck plate 14 overlaps the annealing object 30 but does not come into contact with the annealing object 30.

Next, a result of an evaluation experiment using a laser annealing device according to a comparative example will be described referring to FIGS. 3, 4A, and 4B. In the laser annealing device according to the comparative example, a ceramic chuck plate is used as the chuck plate 14 (FIGS. 1 and 2B) shown in FIG. 1. A silicon wafer is used as the annealing object 30.

Figure 3:
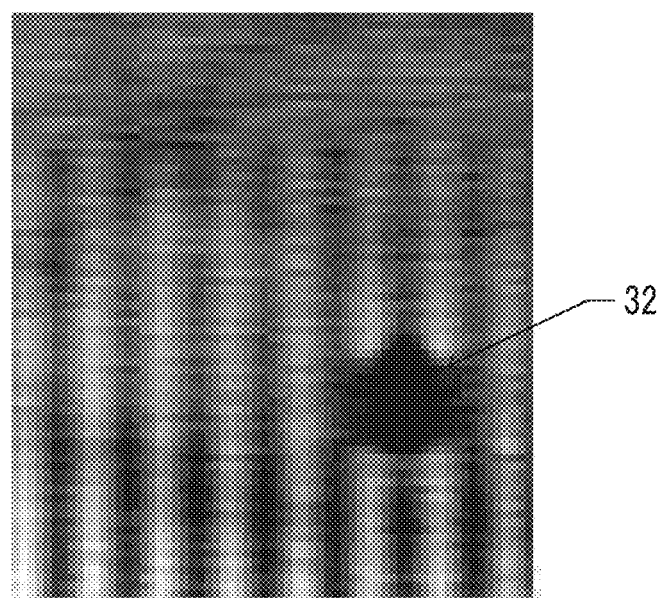
FIG. 3 is a diagram showing a portion of a distribution of a detection result of intensity of thermal radiation light acquired when an annealing object is annealed using a laser annealing device according to a comparative example.

FIG. 3 is a diagram showing a portion of a distribution of a detection result of intensity of thermal radiation light acquired during annealing of the annealing object 30. It is represented that a deep gray region is lower in temperature than a light gray region. The reason that a stripe pattern in a vertical direction appears in FIG. 3 is because a silicon wafer is scanned in the vertical direction with a laser beam.

At a place directly above the through-hole 18 (FIG. 2B), heat generated in the silicon wafer is not transmitted to the outside through the chuck plate 14 (FIG. 2B), it is considered that a temperature is likely to be higher than at a place in contact with the chuck plate 14. On the contrary, in the measurement result shown in FIG. 3, a result that a measured value of a temperature at a position 32 corresponding to the through-hole 18 (FIG. 2B) is lower than a measured value of a surrounding temperature is obtained. It is understood that the measured value of the temperature becomes low corresponding to a region where the groove 16 (FIG. 2A) is provided.

The reason that the measured value of the temperature at the position corresponding to the through-hole 18 (FIG. 2B) is lower than the measured value of the surrounding temperature will be described referring to FIGS. 4A and 4B.

Figure 4A:
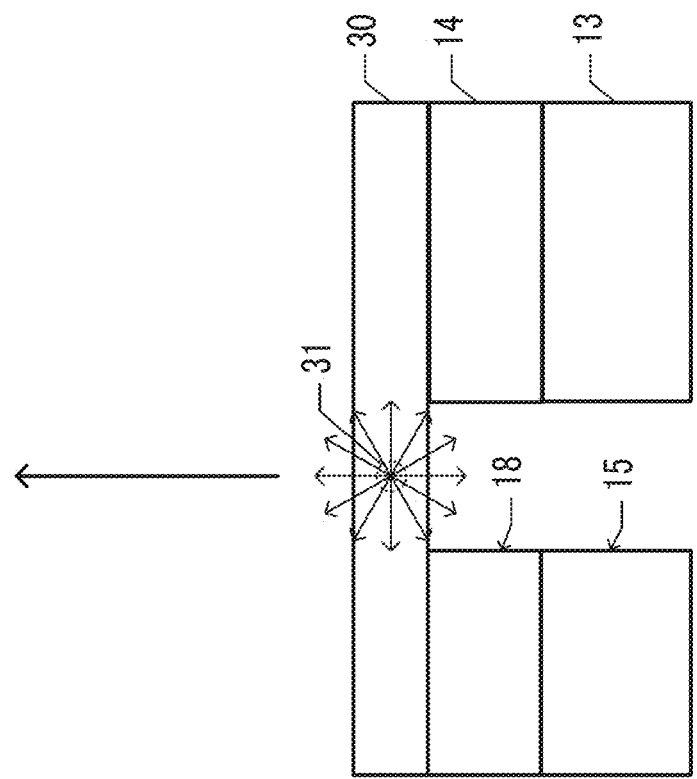
FIG. 4A is a sectional view of a chuck plate, a holding table, and an annealing object in the laser annealing device according to the comparative example at a place where a through-hole is not provided.

FIG. 4A is a sectional view of the annealing object 30, the chuck plate 14, and the holding table 13 at a place where the through-hole 18 is not provided. In a case where a laser beam is incident on the annealing object 30 and the annealing object 30 is heated, thermal radiation light is emitted from a high-temperature place 31. Thermal radiation light that is directed upward is incident on the thermal radiation light detector 25 (FIG. 1) directly. In the specification, thermal radiation light that is directed upward from the high-temperature place 31 and is incident on the thermal radiation light detector 25 is referred to as "direct light".

Thermal radiation light that is directed downward from the high-temperature place 31 propagates through the chuck plate 14 in a thickness direction, is reflected from the surface of the holding table 13, is then transmitted through the chuck plate 14 and the annealing object 30, and is incident on the thermal radiation light detector 25. In the specification, thermal radiation light that is directed downward from the high-temperature place 31, is reflected from the upper surface of the holding table 13, and is then incident on the thermal radiation light detector 25 is referred to as "indirect light". In this way, the total intensity of direct light and indirect light is measured in the region where the through-hole 18 is not provided.

Figure 4B:
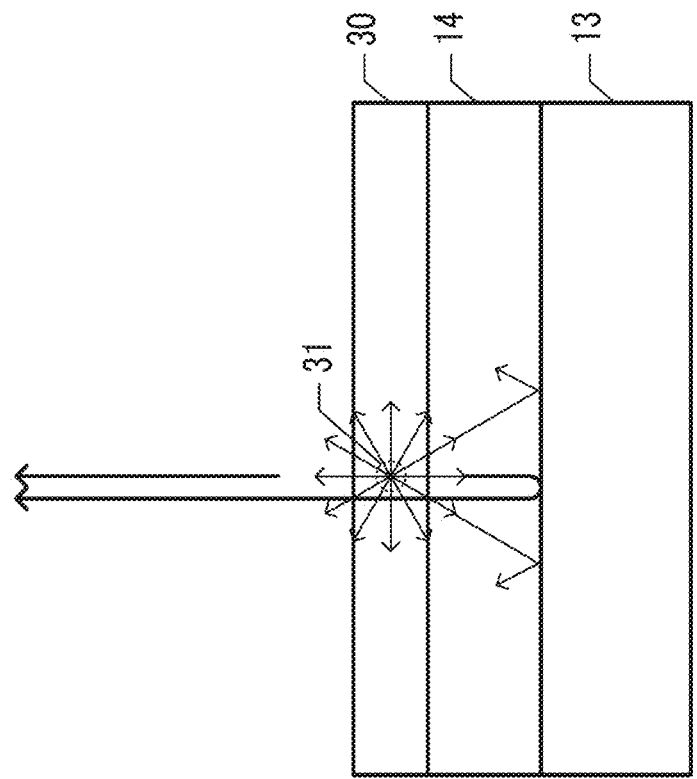
FIG. 4B is a sectional view of the chuck plate, the holding table, and the annealing object at a place where a through-hole is provided.

FIG. 4B is a sectional view of the annealing object 30, the chuck plate 14, and the holding table 13 at a place where the through-hole 18 is provided. Thermal radiation light that is radiated from the high-temperature place 31 and is directed downward is radiated from a rear surface of the chuck plate 14 into internal cavities of the through-hole 18 and the hole 15. For this reason, thermal radiation light that is directed downward is not reflected from the upper surface of the holding table 13, and is not incident on the thermal radiation light detector 25.

In the region where the through-hole 18 is disposed, the intensity of only direct light is measured, and the intensity of indirect light is not added to the measured value. As a result, the measured value of the temperature at the place where the through-hole 18 is provided is lower than the measured value of the temperature surrounding the place.

Even in the region where the groove 16 (FIG. 2A) is provided, the measurement result of the temperature becomes low for the same reason.

In this way, since a measurement environment is different between the place where the through-hole 18 is provided and the place where the through-hole 18 is not provided, accurate temperature measurement cannot be performed. In the embodiment described below, accurate temperature measurement can be performed.

Figure 5A:
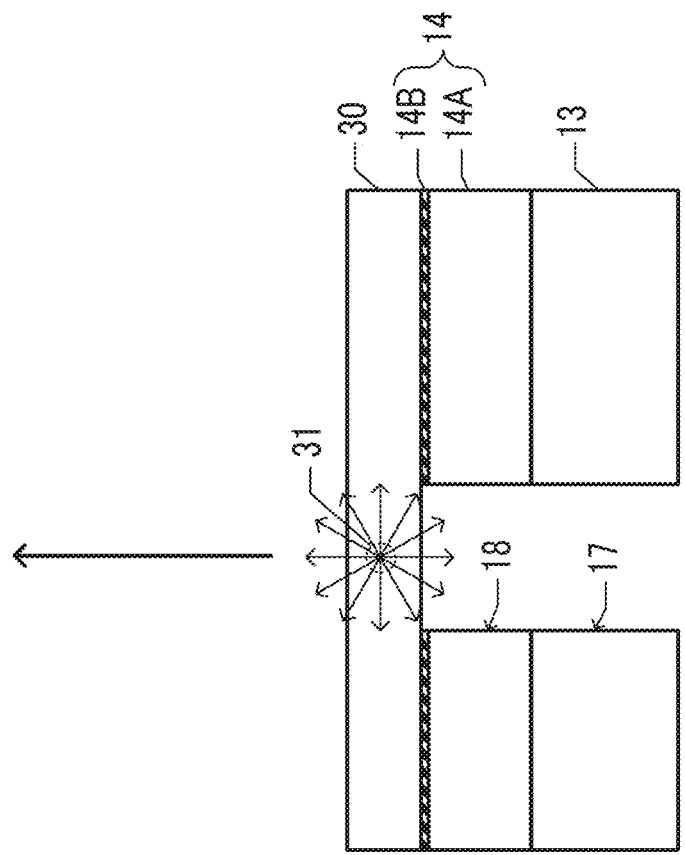
FIG. 5A is a sectional view of the chuck plate, the holding table, and an annealing object of the laser annealing device according to the embodiment at a place where a through-hole is not provided.
Figure 5B:
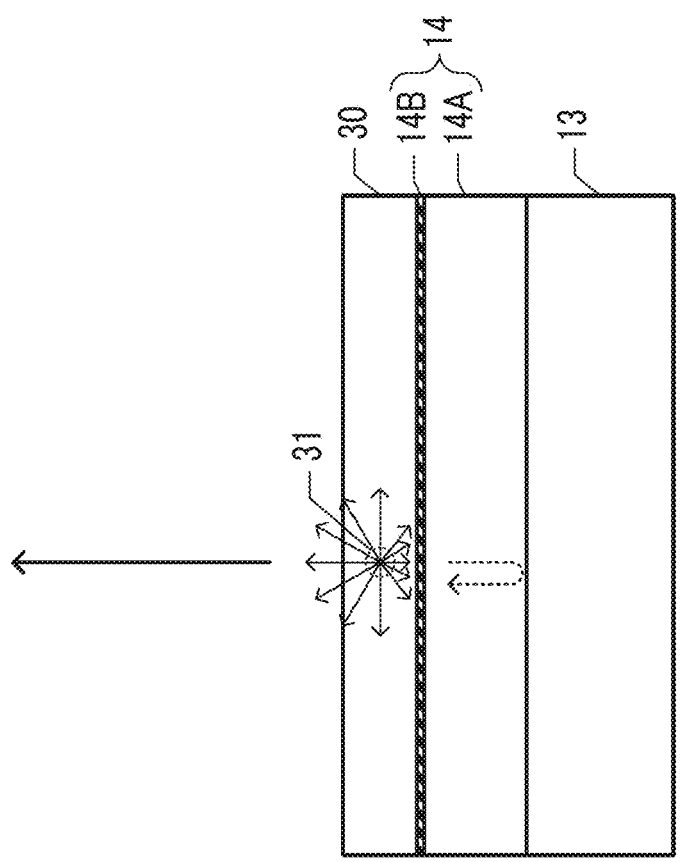
FIG. 5B is a sectional view of the chuck plate, the holding table, and the annealing object at a place where a through-hole is provided.

FIGS. 5A and 5B are sectional views of the chuck plate 14, the holding table 13, and the annealing object 30 held on the chuck plate 14 in the laser annealing device according to the embodiment. FIG. 5A is a sectional view at the place where the through-hole 18 is not provided, and FIG. 5B is a sectional view at the place where the through-hole 18 is provided.

The chuck plate 14 that is used in the laser annealing device according to the embodiment includes a main body 14A and an absorbing film 14B coated onto an upper surface of the main body 14A. As the main body 14A, for example, a plate formed of ceramic is used. The absorbing film 14B absorbs or attenuates light in a wavelength range (for example, a wavelength of 1 μm to 3 μm) of thermal radiation light. As the absorbing film 14B, for example, a film including black dye is used.

As shown in FIG. 5A, thermal radiation light that is radiated from the place 31 where the through-hole 18 is not provided and is directed downward is absorbed or attenuated by the absorbing film 14B. Thermal radiation light that is reflected by the holding table 13 and is directed upward is also absorbed or attenuated by the absorbing film 14B. For this reason, the intensity of indirect light incident on the thermal radiation light detector 25 (FIG. 1) is sufficiently lower than the intensity of direct light.

As shown in FIG. 5B, even at the place where the through-hole 18 is provided, as in the example shown in FIG. 4B, indirect light is not incident on the thermal radiation light detector 25 (FIG. 1).

As described above, in the embodiment, at both of the place where the through-hole 18 is provided and the place where the through-hole 18 is not provided, the intensity of only direct light that is directed upward from the high-temperature place 31 can be measured. For this reason, it can be said that a measurement condition of the temperature is substantially equal between the place where the through-hole 18 is provided and the place where the through-hole 18 is not provided. For this reason, the measurement accuracy of the temperature distribution can be increased.

Figure 6:
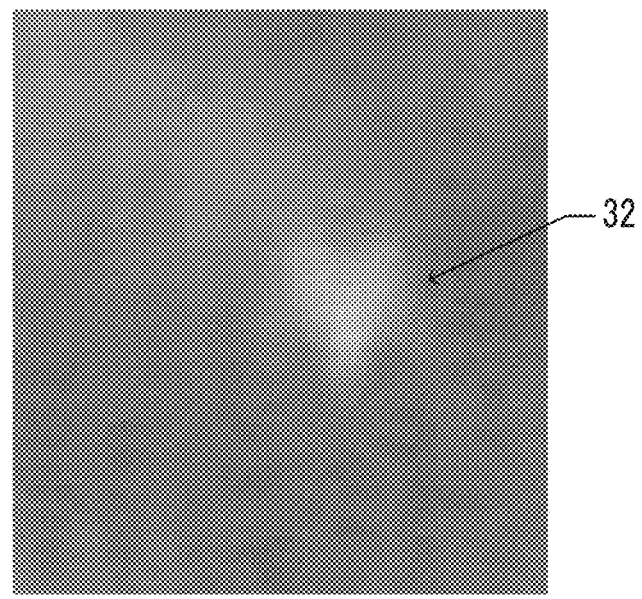
FIG. 6 is a diagram showing a distribution of a detection result of intensity of thermal radiation light acquired when annealing is performed using the laser annealing device according to the embodiment.

FIG. 6 is a diagram showing a portion of a distribution of a detection result of the intensity of thermal radiation light acquired when annealing is performed using the laser annealing device according to the embodiment. It is represented that a deep gray region is lower in temperature than a light gray region. The measured value of the temperature at the position 32 where the through-hole 18 is provided becomes higher than the measured value of the surrounding temperature. The measurement result coincides with prediction that the temperature at the position where the through-hole 18 is provided becomes higher than the surrounding temperature.

Figure 7:
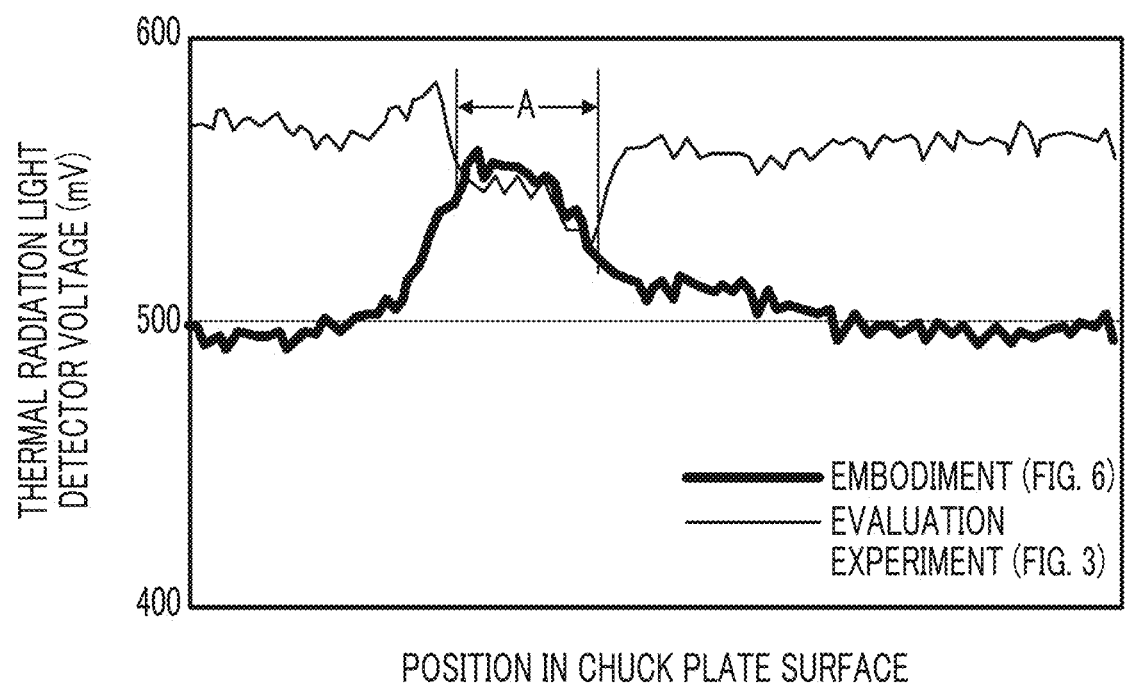
FIG. 7 is a graph comparatively showing a measurement result of a temperature when annealing is performed using the laser annealing device according to the comparative example and a measurement result of a temperature when annealing is performed using the laser annealing device according to the embodiment.

FIG. 7 is a graph comparatively showing the measurement result of the temperature when annealing is performed using the laser annealing device according to the comparative example and the measurement result of the temperature when annealing is performed using the laser annealing device according to the embodiment. In FIG. 7, the measurement result is shown along a straight line parallel to a scanning direction (in FIGS. 3 and 6, a vertical direction) of the annealing object 30. The horizontal axis represents the position within the surface of the annealing object 30, and the vertical axis represents a voltage detected by the thermal radiation light detector 25 (FIG. 1) in a unit of "mV". The detected voltage corresponds to the intensity of thermal radiation light. The intensity of thermal radiation light corresponds to the temperature of the annealing object 30. A thick solid line in the graph of FIG. 7 indicates a measurement result in a case where the chuck plate 14 according to the embodiment is used (FIG. 6), and a thin solid line indicates a measurement result in a case where the chuck plate 14 according to the comparative example with no absorbing film is used (FIG. 3).

In a region A where the through-hole 18 is provided, two measurement results substantially coincide with each other. This is because the measurement environment is substantially equal between both measurement environments as shown in FIGS. 4B and 5B. In a region where the through-hole 18 is not provided, the measurement result (FIGS. 5A and 6) in a case where the laser annealing device according to the embodiment is used is lower than the measurement result (FIGS. 3 and 4A) in a case where the laser annealing device according to the comparative example is used. The reason that such measurement results are obtained is because, while indirect light is also incident on the thermal radiation light detector 25 (FIG. 1) in the comparative example, indirect light is not substantially incident on the thermal radiation light detector 25 (FIG. 1) in the embodiment.

The difference between the thick solid line and the thin solid line in the region where the through-hole 18 is not provided corresponds to the intensity of indirect light. It is understood from the comparison result of the graph shown in FIG. 7 that the intensity of indirect light is about 10% of the intensity of direct light.

In order to measure the temperature distribution with sufficient accuracy, it is preferable that the intensity of indirect light is made to be equal to or less than 1/100 of the intensity of direct light. In order to satisfy the condition, it is preferable that 90% or more of the intensity of thermal radiation light is attenuated while thermal radiation light is propagating along the path along which thermal radiation light is directed downward from the high-temperature place 31 of the annealing object 30, is reflected from the upper surface of the holding table 13, is then transmitted through the annealing object 30, and is directed upward.

In the above-described embodiment, a case where, even though the through-holes 18 are provided in the chuck plate 14, measurement of an accurate temperature distribution can be performed. Even though the through-holes 18 are not provided in the chuck plate 14, with the use of the laser annealing device according to the above-described embodiment, an effect that an accurate temperature distribution can be measured without influence of in-plane variation of a reflection characteristic of the upper surface of the holding table 13 is obtained.

Next, a modification example of the above-described embodiment will be described.

In the above-described embodiment, although the film including black dye is used as the absorbing film 14B (FIGS. 5A and 5B), a film including a material for absorbing or attenuating light in a wavelength range to be detected by the thermal radiation light detector 25 (FIG. 1) may be used. The absorbing film 14B may be provided on a lower surface of the main body 14A of the chuck plate 14 instead of being provided on the upper surface or may be provided on both of the upper surface and the lower surface. In addition, the chuck plate 14 may be formed of a material having a function of attenuating thermal radiation light.

The absorbing film 14B may be provided on the upper surface of the holding table 13 instead of being provided on the chuck plate 14.

In the above-described embodiment, although the annealing object 30 is heated by the laser beam, the annealing object 30 may be heated by other heating mechanisms. For example, the annealing object 30 may be heated by a flash lamp or the like.

Next, an annealing device and an annealing method according to another embodiment will be described referring to FIGS. 1 and 8A to 12B. A laser annealing device according to the embodiment is the same as the laser annealing device shown in the schematic view of FIG. 1.

Figure 8A:
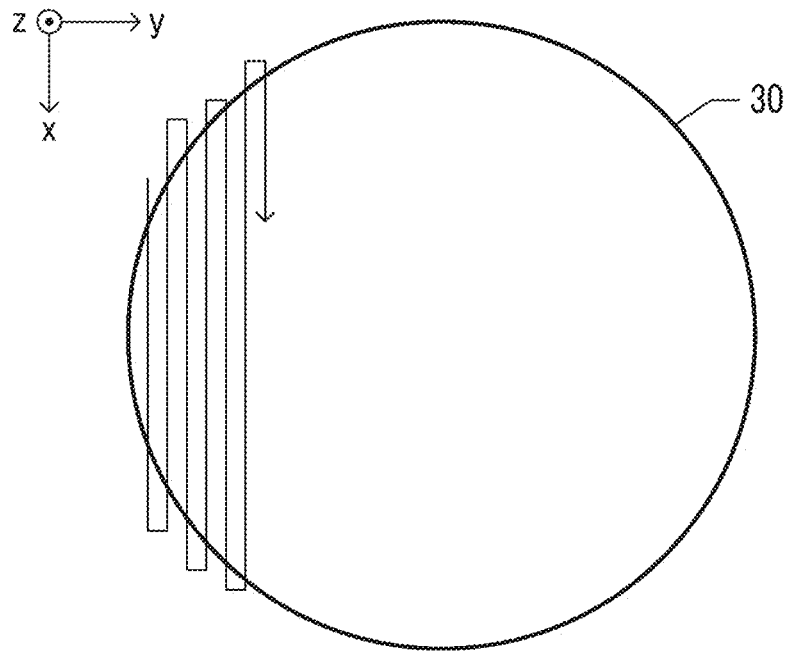
FIG. 8A is a plan view showing a scanning path along which a surface of the annealing object is scanned with a pulsed laser beam.

FIG. 8A is a plan view showing a scanning path along which the surface of the annealing object 30 is scanned with the pulsed laser beam. An xyz rectangular coordinate system in which the surface (laser irradiation surface) of the annealing object 30 is an xy plane and a direction normal to the surface is a positive direction of the z axis is defined. Main scanning and sub-scanning are repeated with the x-axis direction as a main scanning direction and the y-axis direction as a sub-scanning direction, and the substantially entire region of the surface of the annealing object 30 is scanned with the pulsed laser beam.

Figure 8B:
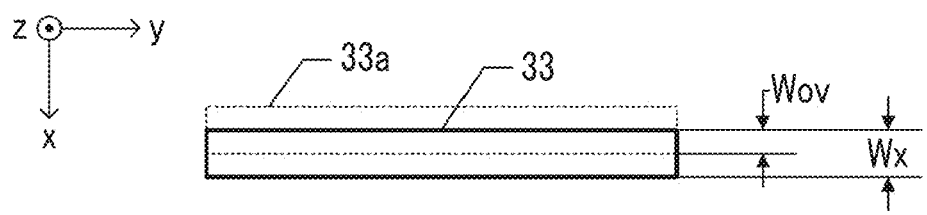
FIG. 8B is a diagram showing a shot-to-shot positional relationship of an irradiation region of the pulsed laser beam during main scanning.

FIG. 8B is a diagram showing a shot-to-shot positional relationship of an irradiation region 33 of the pulsed laser beam during main scanning. The irradiation region 33 has a substantially rectangular planar shape that is long in the y-axis direction. In FIG. 8B, an irradiation region 33a of an immediately preceding shot is indicated by a broken line, and an irradiation region 33 of an immediately following shot is indicated by a solid line. The dimension (width) of the irradiation region 33 in the x-axis direction is represented by Wx. The dimension in the x-axis direction of an overlapping portion of the irradiation regions 33a and 33 of the continuous two shots is represented by Wov. An overlap rate OVRx of the irradiation regions during main scanning is defined as follows.

$$OVRx = Wov/Wx$$

Figure 8C:
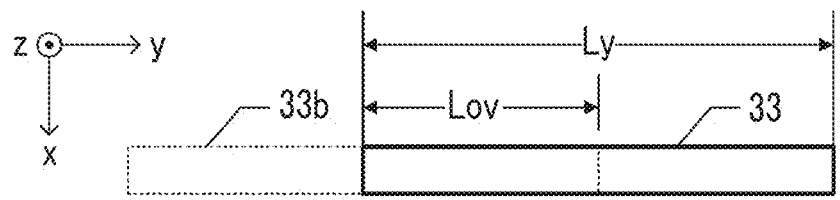
FIG. 8C is a diagram showing a shot-to-shot positional relationship of an irradiation region of the pulsed laser beam before and after sub-scanning.

FIG. 8C is a diagram showing a shot-to-shot positional relationship of an irradiation region 33 of the pulsed laser beam before and after sub-scanning. The irradiation region 33b immediately before sub-scanning is performed is indicated by a broken line, and the irradiation region 33 after sub-scanning is performed is indicated by a solid line. The dimension (length) of the irradiation region 33 in the y-axis direction is represented by Ly. The dimension in the y-axis direction of an overlapping portion of the irradiation regions 33b and 33 before and after single sub-scanning is represented by Lov. An overlap rate OVRy of the irradiation regions during the sub-scanning is defined as follows.

$$OVRy = Lov/Ly$$

Prior to describing the embodiment, a result of an evaluation experiment where annealing is performed at a constant overlap rate will be described.

Figure 9:
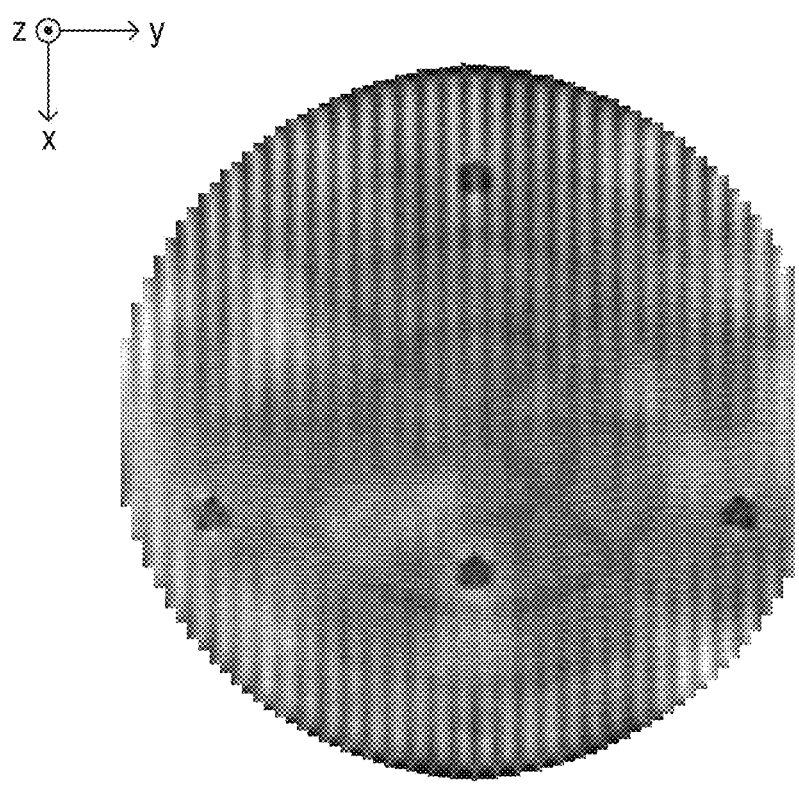
FIG. 9 is a diagram showing a distribution of an annealing temperature when the annealing object is actually annealed.

FIG. 9 is a diagram showing a distribution of an annealing temperature measured when the annealing object 30 is actually annealed. In the evaluation experiment, a chuck plate having no absorbing film 14B (FIGS. 5A and 5B) is used as the chuck plate 14 (FIG. 1). In FIG. 9, in a region where the annealing temperature is high, the depth of gray is represented light. The reason that a region where the annealing temperature is observed to be relatively low appears radially and concentrically is because a planar shape of the groove for adsorption provided in the holding table 13 (FIG. 1) is reflected. The region where the annealing temperature is observed to be relatively low appears corresponding to four places where a lift pin is disposed. Considering excluding a special condition of a base, such as the groove for adsorption or the lift pin, vertical stripes parallel to the x-axis direction (main scanning direction) appear. In addition, it is understood that the annealing temperature tends to be higher near both ends in the y-axis direction (sub-scanning direction) than in a region inside near both ends in the y-axis direction.

Figure 10A:
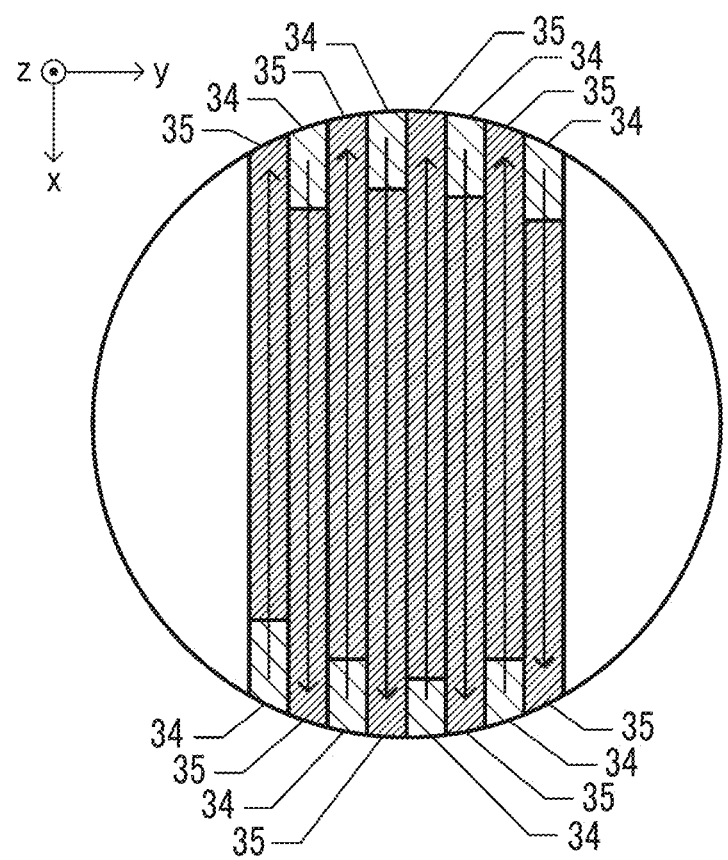
FIG. 10A is a diagram schematically showing a distribution of an annealing temperature in the x-axis direction.

FIG. 10A is a diagram schematically showing the distribution of the annealing temperature in the x-axis direction. Focusing on a linear region parallel to the x-axis to be scanned by single main scanning, the annealing temperature becomes relatively higher in a partial region 34 on a start point side of scanning than in a remaining region 35 on an end point side. In FIG. 10A, a region where the annealing temperature becomes relatively high is hatched with relatively low density, and a region where the annealing temperature becomes relatively low is hatched with relatively high density. In FIG. 10A, although the boundary between the region 34 where the annealing temperature is high and the region 35 where the annealing temperature is low is shown clearly, actually, the boundary between both regions is not clear, and the annealing temperature is gradually changed in the x-axis direction.

The reason that the annealing temperature becomes high in the region 34 on the start point side of main scanning is because an influence (heat storage effect) of heating during main scanning immediately before sub-scanning remains. In this way, focusing on a region to be scanned by single main scanning, it has been confirmed that temperature unevenness occurs in the x-axis direction.

Figure 10B:
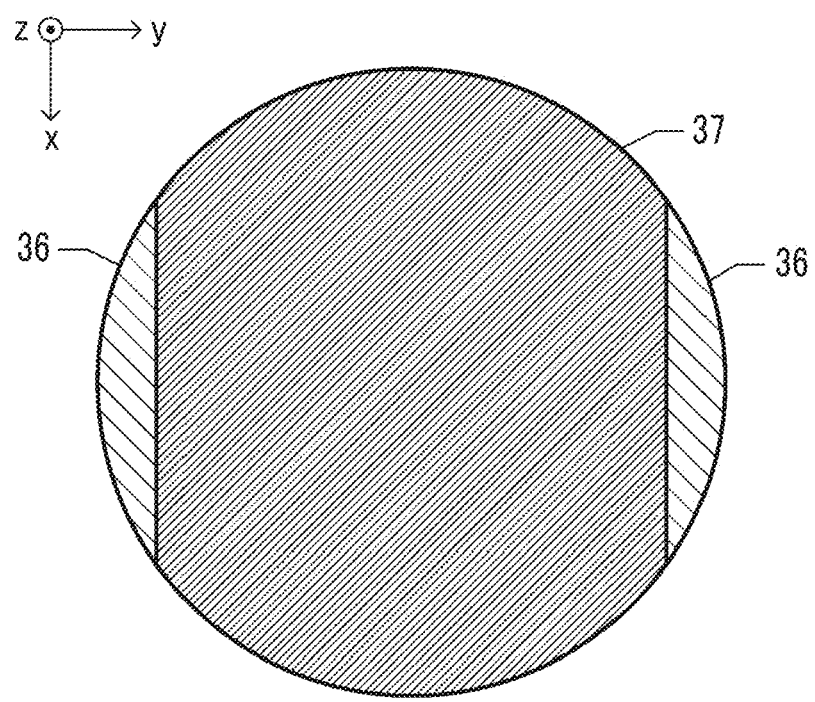
FIG. 10B is a diagram schematically showing a distribution of an annealing temperature in the y-axis direction.

FIG. 10B is a diagram schematically showing the distribution of the annealing temperature in the y-axis direction. FIG. 10B represents a distribution of an average value of the annealing temperature in the x-axis direction in the linear region parallel to the x-axis to be scanned by single main scanning. An average value of the annealing temperature in a region 36 near both ends in the y-axis direction (sub-scanning direction) tends to be higher than an average value of the annealing temperature in a region inside the region 36. In FIG. 10B, the region where the average value of the annealing temperature is relatively high is hatched with relatively low density, and the region where the average value of the annealing temperature is relatively low is hatched with relatively high density. In FIG. 10B, although the boundary between the region 36 where the average value of the annealing temperature is high and a region 37 where the average value of the annealing temperature is low is shown clearly, actually, the boundary between both regions is not clear, and the average value of the annealing temperature is gradually changed in the y-axis direction.

The reason that the average value of the annealing temperature becomes relatively high in the region 36 near both ends in the y-axis direction is because a temperature decrease due to propagation of heat in an in-plane direction is little in the region 36. In this way, it has been confirmed that unevenness in the average value of the annealing temperature occurs even in the y-axis direction.

In an embodiment described below, temperature unevenness is reduced by changing an overlap rate during main scanning.

Figure 11:
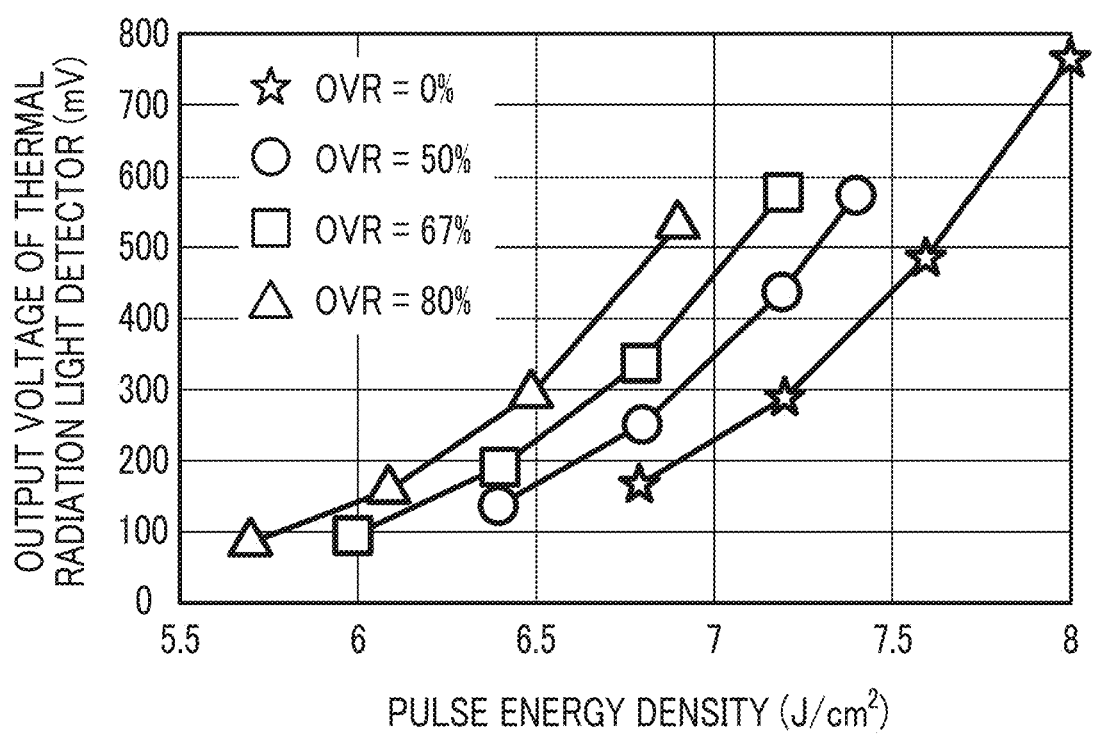
FIG. 11 is a graph showing a relationship between pulse energy density of the pulsed laser beam incident on the annealing object and an output voltage of a temperature sensor for each overlap rate.

FIG. 11 is a graph showing a relationship between energy density (pulse energy density) per pulse of a pulsed laser beam incident on the annealing object 30 and an output voltage of the thermal radiation light detector 25 (FIG. 1) for each overlap rate. The horizontal axis represents pulse energy density in a unit of "J/cm$^2$", and the vertical axis represents the output voltage of the thermal radiation light detector 25 in a unit of "mV". The output voltage of the thermal radiation light detector 25 depends on the annealing temperature of the annealing object 30.

A star symbol, a circle symbol, a quadrangle symbol, and a triangle symbol in the graph of FIG. 11 indicate measured values of the output voltage when the overlap rate OVRx in the x-axis direction is 0%, 50%, 67%, and 80%, respectively. It is understood that, in a case where the pulse energy density is high, the annealing temperature increases. Furthermore, it is understood that the annealing temperature becomes high as the overlap rate OVRx is high under a condition that the pulse energy density is constant.

It is understood from the result shown in FIG. 11 that the annealing temperature can be controlled by adjusting the overlap rate OVRx in the x-axis direction. In the embodiment, the annealing temperature is adjusted by changing the overlap rate OVRx of the irradiation region of a present shot and a next shot based on a measurement result of the annealing temperature with the irradiation of the pulsed laser beam in one shot.

Figure 12A:
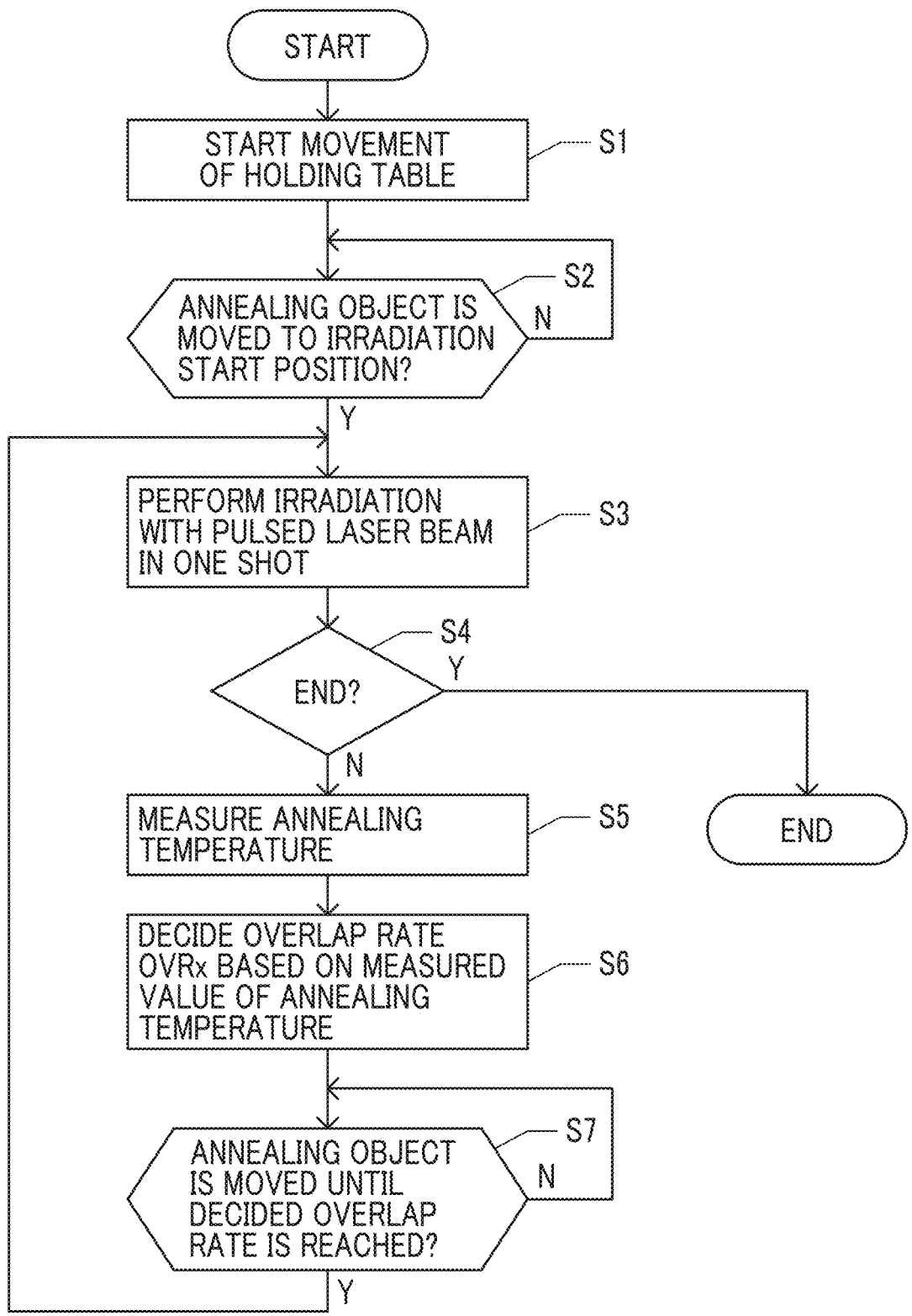
FIG. 12A is a flowchart showing a procedure when annealing is performed using the annealing device according to the embodiment.

FIG. 12A is a flowchart showing a procedure when annealing is performed using the annealing device according to the embodiment. The procedure shown in the flowchart is executed by the control device 40 (FIG. 1) controlling the scanning mechanism 12 and the laser source 20.

First, the movement of the holding table 13 is started while the annealing object 30 is held on the holding table 13 (FIG. 1) (Step S1). For example, the holding table 13 (FIG. 8A) is moved in the x-axis direction at the substantially same speed in a period of single main scanning.

Determination is made whether or not the annealing object 30 is moved to an irradiation start position (Step S2), and the irradiation of the pulsed laser beam in one shot is performed when the annealing object 30 is moved to the irradiation start position (Step S3). After the entire region of the annealing object 30 is annealed, the process ends (Step S4).

The control device 40 reads the output voltage from the thermal radiation light detector 25 and acquires information relating to the annealing temperature (Step S5). The control device 40 performs feedback control such that the measurement result of the annealing temperature is close to a target value Tt with the overlap rate OVRx as a manipulated variable. For example, the control device 40 decides an overlap rate OVRx of an irradiation region of an immediately preceding shot and an irradiation region of a next shot in the x-axis direction based on the measurement result of the annealing temperature such that the annealing temperature is close to the target value Tt (Step S6).

Figure 12B:
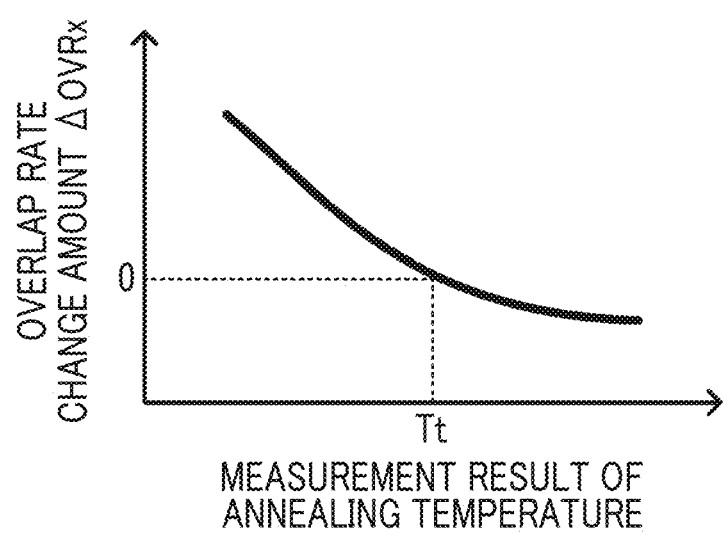
FIG. 12B is a graph showing an example of a relationship between a measurement result of an annealing temperature and a change amount $\Delta OVRx$ of an overlap rate OVRx in the x-axis direction.

FIG. 12B is a graph showing an example of a relationship between the measurement result of the annealing temperature and a change amount ΔOVRx of the overlap rate OVRx in the x-axis direction. The horizontal axis represents the measurement result of the annealing temperature, and the vertical axis represents the change amount ΔOVRx of the overlap rate OVRx. In a case where the measurement result of the annealing temperature coincides with the target value Tt, the change amount ΔOVRx of the overlap rate OVRx is zero, and the overlap rate OVRx at the present time is maintained.

In a case where the measurement result of the annealing temperature is higher than the target value, the change amount ΔOVRx of the overlap rate OVRx is made to be negative, and in a case where the measurement result of the annealing temperature is lower than the target value, the change amount ΔOVRx of the overlap rate OVRx is made to be positive. That is, in a case where the measurement result of the annealing temperature is higher than the target value, the overlap rate OVRx is made to be lower than a current overlap rate OVRx, and in a case where the measurement result of the annealing temperature is lower than the target value, the overlap rate OVRx is made to be higher than the current overlap rate OVRx. In both cases, as a deviation between the target value Tt and the measurement result of the annealing temperature is larger, an absolute value of the change amount ΔOVRx is made to be greater.

After the overlap rate OVRx is decided, the output of the pulsed laser beam is on standby until the annealing object 30 reaches a position where irradiation of the next shot is performed at the decided overlap rate OVRx (Step S7). After the annealing object 30 is moved to a predetermined position, the irradiation of the pulsed laser beam in one shot is performed (Step S3). Hereinafter, the processing from Step S4 to Step S3 is repeatedly executed until the process ends.

Next, excellent effects that are obtained by employing the annealing method using the annealing device according to the above-described embodiment will be described.

In the embodiment, since the overlap rate OVRx is adjusted based on the measurement result of the annealing temperature such that the annealing temperature is close to the target value Tt, the in-plane uniformity of the annealing temperature can be increased. With this, the in-plane uniformity of an activation rate of the dopant can be increased.

In the embodiment, since the annealing temperature is adjusted by changing the overlap rate OVRx without changing the power and the pulse width of the pulsed laser beam output from the laser source 20 (FIG. 1), even though a laser oscillator that hardly changes the power or the pulse width is used, the annealing temperature can be adjusted.

Next, an annealing device and an annealing method according to another embodiment will be described referring to FIGS. 13A to 14. In the embodiment, the overlap rate OVRx is changed according to the position within the surface of the annealing object 30. For example, in a case where annealing is performed at the constant overlap rate OVRx, the overlap rate OVRx is set to be low in a region where the annealing temperature tends to become high.

Next, how the overlap rate OVRx should be changed according to the position within the surface of the annealing object 30 will be described.

Figure 13A:
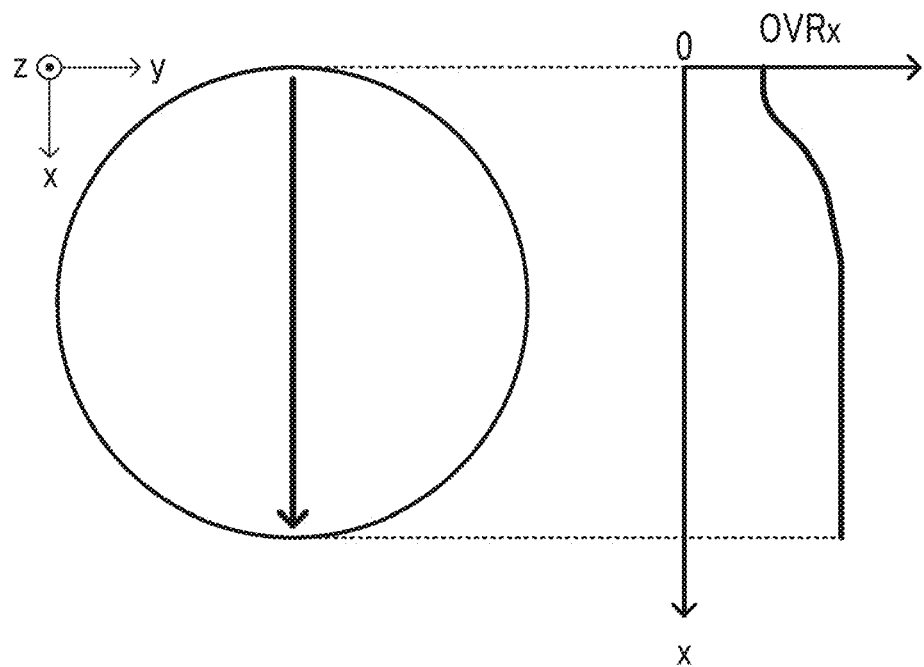
FIGS. 13A and 13B are graphs showing an example of a change in overlap rate OVRx when annealing is performed using a method according to the embodiment shown in FIGS. 8A to 12B.
Figure 13B:
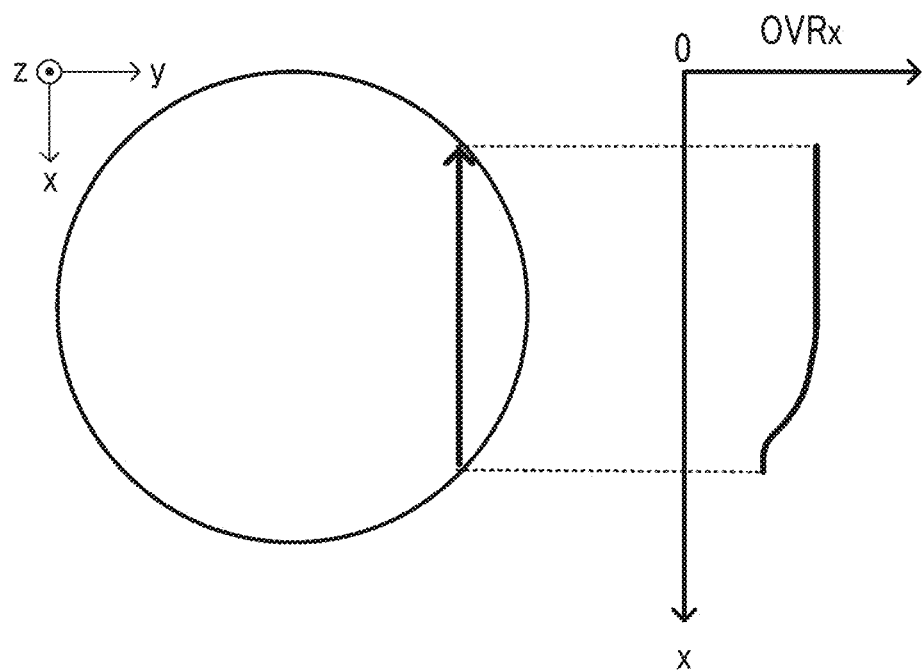

FIGS. 13A and 13B are graphs showing an example of a change in overlap rate OVRx when annealing is performed using the method according to the embodiment shown in FIGS. 1 and 8A to 12B. In a case where the overlap rate OVRx is made to be constant, as shown in FIG. 10A, the annealing temperature becomes relatively high near the start point of main scanning. In the above-described embodiment is applied, in both of a case where main scanning is performed in a positive direction of the x axis (FIG. 13A) and a case where main scanning is performed in a negative direction of the x axis FIG. 13B), in order to make the annealing temperature close to the target value Tt, control is performed such that the overlap rate OVRx is made to be higher as an irradiation position of the pulsed laser beam is farther from the start point of the main scanning.

Accordingly, in making the annealing temperature uniform in single main scanning, the overlap rate OVRx may be made to be higher as the irradiation position of the pulsed laser beam is farther from the start point of main scanning.

Figure 14:
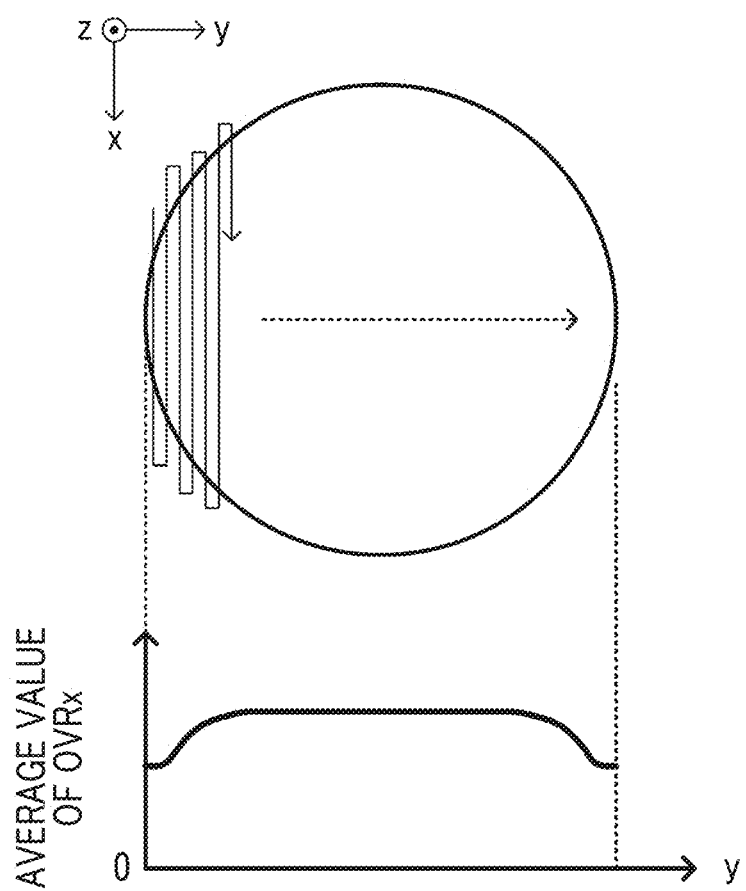
FIG. 14 is a graph showing an example of a change in average value of the overlap rate OVRx of each main scanning when annealing is performed using the method according to the embodiment shown in FIGS. 1 and 8A to 12B.

FIG. 14 is a graph showing an example of a change in average value of the overlap rate OVRx of each main scanning when annealing is performed using the method according to the embodiment shown in FIGS. 1 and 8A to 12B. In a case where the overlap rate OVRx is made to be constant, as shown in FIG. 10B, the annealing temperature is relatively high near both ends in the y-axis direction. In a case where the embodiment shown in FIGS. 1 and 8A to 12B is applied, in order to make the annealing temperature close to the target value Tt, control is performed such that the overlap rate OVRx is made to be relatively low near both ends in the y-axis direction.

Accordingly, in order to make the annealing temperature uniform in the y-axis direction, the average value of the overlap rate OVRx near both ends in the y-axis direction should be set to be lower than the average value of the overlap rate OVRx inside near both ends in the y-axis direction.

A preferred relationship between the position within the surface of the annealing object 30 and the overlap rate OVRx can be decided by performing a plurality of evaluation experiments while changing the overlap rate OVRx. The preferred relationship between the position within the surface of the annealing object 30 and the overlap rate OVRx is stored in the storage device 41. The control device 40 changes the overlap rate OVRx based on the preferred relationship.

In the embodiment, the annealing temperature can be made uniform within the plane. In a case where annealing is performed at a constant repetition frequency of the pulse of the pulsed laser beam output from the laser source 20, a movement speed of the annealing object 30 can be increased in a region having the relatively low overlap rate OVRx near the start point of each main scanning shown in FIGS. 13A and 13B. For this reason, an effect that the annealing time is made to be short is obtained compared to a case where annealing is performed on the region near the start point of main scanning at the same overlap rate OVRx as that in the inner portion and on the end point side.

The above-described embodiments are examples, and a partial replacement or a combination of the configurations shown in the embodiments and the modification example is possible. The same advantageous effects by the same configurations in the embodiment and the modification example are not consecutively mentioned for the embodiment and the modification example. In addition, the present invention is not limited to the embodiments and the modification example described above. For example, it will be obvious to those skilled in the art that various alterations, improvements, combinations, and the like can be made.

It should be understood that the invention is not limited to the above-described embodiment, but may be modified into various forms on the basis of the spirit of the invention. Additionally, the modifications are included in the scope of the invention.

What is claimed is:

1. A chuck plate that is disposable between an annealing object and a holding table for use, and has a function of attenuating thermal radiation light radiated from the annealing object and directed toward the holding table, the chuck plate comprising:
   an upper surface on which the annealing object is held;
   a lower surface facing the holding table; and
   an absorbing film comprising a dye that is configured to absorb the thermal radiation light,
wherein the upper surface comprises:
   a uniform region that is configured to be brought into contact with the annealing object in a state in which the annealing object is held, and
   a noncontact region that is configured not to be brought into contact with the annealing object,
wherein the absorbing film is on one of the uniform region or the lower surface.

2. An annealing device comprising:
a holding table that is configured to hold an annealing object;
a chuck plate that is disposable between the holding table and the annealing object;
a heating mechanism that is configured to heat the annealing object; and
a thermal radiation light detector that is held on the holding table and configured to detect thermal radiation light from the annealing object heated by the heating mechanism,
wherein the chuck plate has a function of attenuating thermal radiation light radiated from the annealing object and directed toward the holding table, and includes an upper surface on which the annealing object is configured to be held, and a lower surface facing the holding table,
wherein the upper surface includes a uniform region that is configured to be brought into contact with the annealing object in a state in which the annealing object is held, and a noncontact region that is configured not to be brought into contact with the annealing object, and
wherein an absorbing film including dye for absorbing the thermal radiation light is provided on one of the uniform region or the lower surface.

3. The annealing device according to claim 2,
wherein the chuck plate is configured to attenuate the thermal radiation light in a wavelength range detected by the thermal radiation light detector.

4. The annealing device according to claim 2,
wherein the noncontact region is configured to overlap the annealing object while being not brought into contact with the annealing object.

5. The annealing device according to claim 2,
wherein the dye for absorbing thermal radiation light radiated from the annealing object and directed toward the holding table is coated onto one of an upper surface of the chuck plate or a lower surface.

6. The annealing device according to claim 2,
wherein the heating mechanism comprises:
a laser source that is configured to output a pulsed laser beam,
a scanning mechanism that is configured to scan a surface of the annealing object with the pulsed laser beam, and
a control device that is configured to perform control such that the laser source and the scanning mechanism scan the surface of the annealing object with the pulsed laser beam while making irradiation regions overlap between shots of the pulsed laser beam, and
the control device is configured to change an overlap rate based on a measurement result of the thermal radiation light detector.

7. The annealing device according to claim 6,
wherein the control device is configured to change the overlap rate such that the measurement result of the thermal radiation light detector is close to a target value.

8. The annealing device according to claim 2,
wherein the heating mechanism comprises:
a laser source that is configured to output a pulsed laser beam,
a scanning mechanism that is configured to scan a surface of the annealing object with the pulsed laser beam, and
a control device that is configured to control the laser source and the scanning mechanism to scan the surface of the annealing object with the pulsed laser beam while making irradiation regions overlap between shots of the pulsed laser beam, and
the control device has a function of changing an overlap rate depending on a position in the surface of the annealing object.

9. The annealing device according to claim 8,
wherein the control device is configured to repeat main scanning and sub-scanning to perform annealing in scanning the surface of the annealing object, and is configured to decrease the overlap rate as a distance from a start point of main scanning increases for each main scanning.

10. The annealing device according to claim 8,
wherein the control device is configured to set an average value of the overlap rate when main scanning is performed on an end region including both ends of the annealing object in a sub-scanning direction to be smaller than an average value of the overlap rate when main scanning is performed inside the end region.

11. An annealing method comprising:
holding an annealing object on a holding table;
disposing a chuck plate, which comprises an upper surface on which the annealing object is held and a lower surface facing the holding table, between the holding table and the annealing object, the upper surface including a uniform region that is brought into contact with the annealing object in a state in which the annealing object is held, and a noncontact region that is not brought into contact with the annealing object;
heating the annealing object held on the holding table;
measuring intensity of thermal radiation light directed upward from the heated annealing object; and
absorbing or attenuating thermal radiation light from the heated annealing object toward the holding table, reflected by the holding table, transmitted through the annealing object, and directed toward above the annealing object, by an absorbing film including dye for absorbing the thermal radiation light.

12. The annealing method according to claim 11,
wherein, when the annealing object is heated,
a surface of the annealing object is scanned with the pulsed laser beam while making irradiation regions overlap between shots of the pulsed laser beam, and
an overlap rate is changed based on a measurement result of a temperature of a place heated by incidence of the pulsed laser beam.

13. The annealing method according to claim 12,
wherein the overlap rate is changed such that the measurement result of the temperature of the annealing object is close to a target value.

14. The annealing method according to claim 11,
wherein, when the annealing object is heated,
a surface of the annealing object is scanned with the pulsed laser beam while making irradiation regions overlap between shots of the pulsed laser beam, and
an overlap rate is changed depending on a position in the surface of the annealing object.

15. The annealing method according to claim 14,
wherein main scanning and sub-scanning are repeated to perform annealing in scanning the surface of the annealing object, and
the overlap rate is decreased as a distance from a start point of main scanning increases for each main scanning.

16. The annealing method according to claim 14,
wherein an average value of the overlap rate when main scanning is performed on a certain region including both ends of the annealing object in a sub-scanning direction is set to be smaller than an average value of the overlap rate when main scanning is performed inside the region.

\* \* \* \* \*